United States Patent [19]
Ogawa et al.

[11] Patent Number: 5,485,018
[45] Date of Patent: Jan. 16, 1996

[54] NANOFABRICATED DEVICE FOR MULTIPLE-STATE LOGIC OPERATION

[75] Inventors: Kensuke Ogawa; Jeremy Allam, both of Cambridge, United Kingdom

[73] Assignee: Hitachi, Ltd., Tokyo, Japan

[21] Appl. No.: 250,262

[22] Filed: May 27, 1994

[30] Foreign Application Priority Data

May 28, 1993 [GB] United Kingdom ............ 9311111

[51] Int. Cl.$^6$ ............ H01L 29/06; H01L 31/0328; H01L 31/0336
[52] U.S. Cl. ............ 257/24; 257/14; 257/21; 257/187; 257/192
[58] Field of Search ............ 257/14, 21, 24, 257/187

[56] References Cited

U.S. PATENT DOCUMENTS

| | | | |
|---|---|---|---|
| 5,051,791 | 9/1991 | Baldwin et al. | 257/183 |
| 5,105,232 | 4/1992 | Del Alamo et al. | 257/24 |
| 5,138,408 | 8/1992 | Ando | 257/138 |
| 5,148,242 | 9/1992 | Tsukada et al. | 257/24 |
| 5,283,445 | 2/1994 | Saito | 257/24 |
| 5,285,081 | 2/1994 | Ando | 257/24 |
| 5,291,034 | 3/1994 | Allam et al. | 257/21 |

FOREIGN PATENT DOCUMENTS

| | | |
|---|---|---|
| 0357249 | 3/1990 | European Pat. Off. |
| 0517647 | 12/1992 | European Pat. Off. |

OTHER PUBLICATIONS

Eisenstein et al, "Independently Contacted 2-Dimensional Electron Systems in Double Quantum Wells," Appl. Phys. Lett., vol. 57, No. 22, 26 Nov. 1990, pp. 2324–2326.

High–Speed Semiconductor Devices, ed. S. M. Sze, by F. Capasso et al. (John Wiley & Sons, New York 1990): Quantum Effect Devices, Chap. 8, pp. 465–520.

Primary Examiner—Mahshid Saadat
Attorney, Agent, or Firm—Kenyon & Kenyon

[57] ABSTRACT

A nanofabricated logic device, operable at multiple (more than two) logic levels comprises asymmetrically coupled quantum point contacts provided with respective sources and drains and a coupling region between gate electrodes. The quantum mechanical carrier wavefunction in the region of QPC1, 2 is spatially asmmetric with alternate quantised energy levels lying either in QPC1, or QPC2, so that by changing the energy level, the conductance of the device can be switched between multiple stable conductance levels. The device can be used to provide a multilevel output switched in response to terahertz pulses provided by an array of optical detectors.

22 Claims, 13 Drawing Sheets

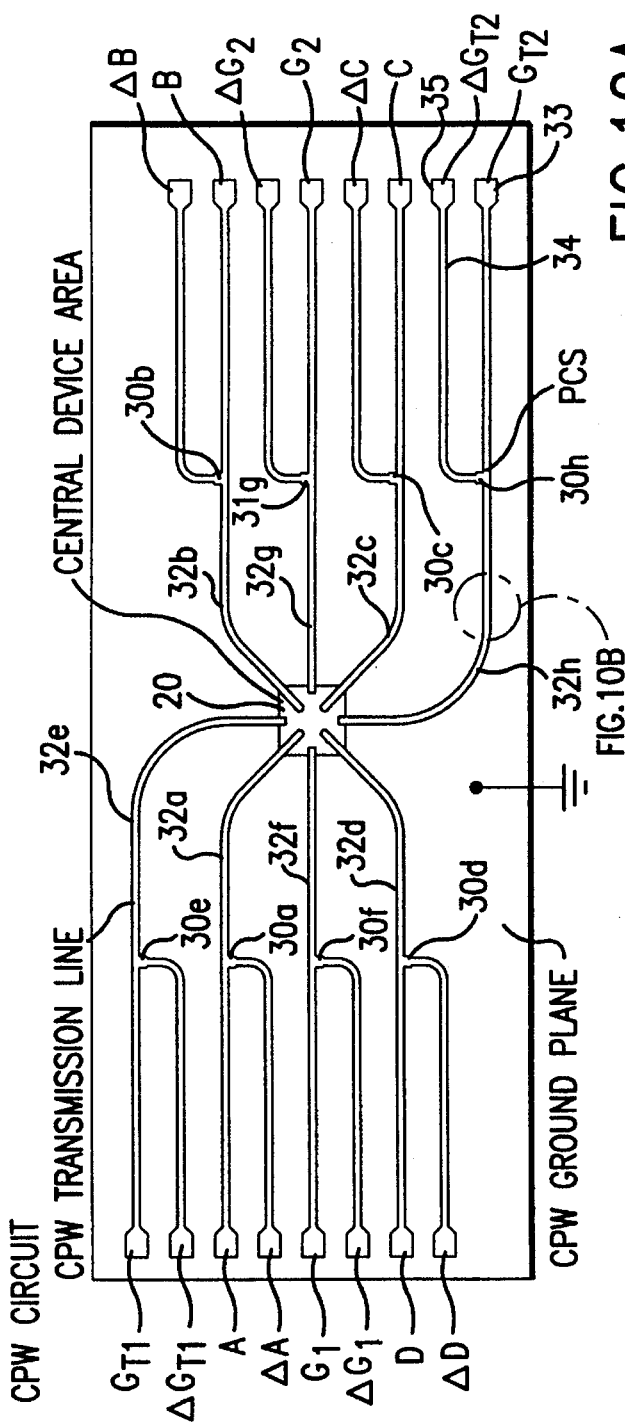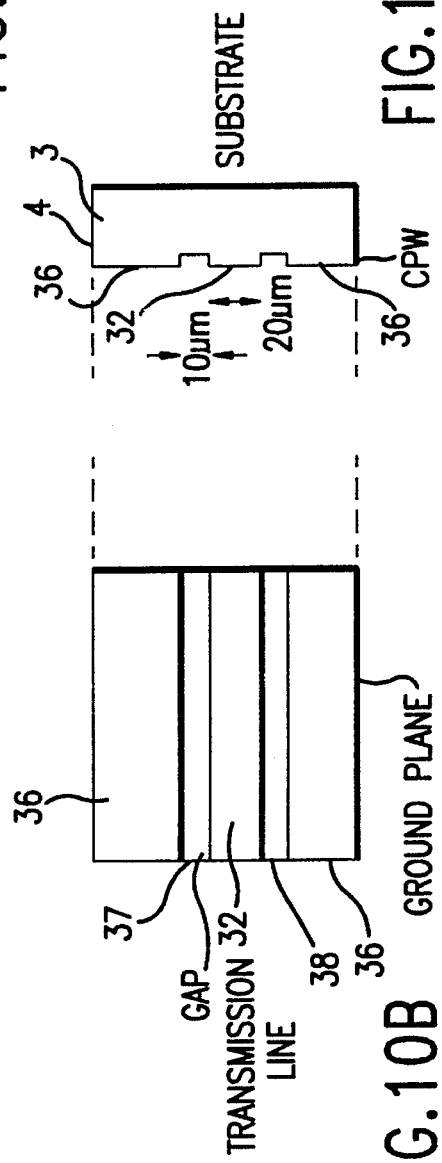

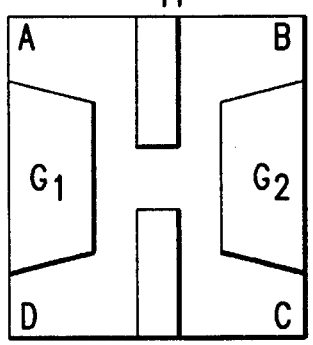

NANOFABRICATED DEVICE FOR MULTIPLE-STATE LOGIC OPERATION

FIELD OF THE INVENTION

This invention relates to a nanofabricated device which may be used for multiple-state logic operation and other signal processing.

BACKGROUND

Conventional logic circuit devices generally operate with binary logic, such that each circuit element operates only with two states. When large amounts of data are to be processed, a very large degree of integration is required in electronic circuits in order to enable this to occur. Multiple-state logic devices have been proposed i.e. devices with more than two stable states with a view to reducing the total size of the devices and to accelerate information processing. For example, multiple-state resonant-tunnelling bipolar transistors (RTBTs) have previously been proposed—see F. Capasso, S. Sen and F. Beltram, in High-Speed Semiconductor Devices ed. S. M. Sze (John Wiley & Sons, N.Y. 1990) Chap. 8 "Quantum-Effect Devices": However, these prior devices suffer from the disadvantage that RTBTs need to be stacked in order to achieve a high degree of multiplicity in logic operation and as a result, instability can occur due to background conductance, which can limit the multiplicity that can be achieved.

SUMMARY OF THE INVENTION

In accordance with the invention, there is provided a nanofabricated multiple state electronic device comprising: means for providing a quantum well configuration; means for establishing a quantum mechanical charge carrier wavefunction defining multiple quantised stable energy levels in the quantum well configuration; control means for causing charge in the well configuration to assume different ones of said multiple quantised levels; and output means responsive to said multiple levels for defining corresponding multiple logical output conditions.

As used herein, the term "multiple" means more than two; thus the term "multiple energy levels" means more than two energy levels.

The quantum mechanical charge carrier wavefunction may be spatially asymmetrical, with multiple energy levels occurring at spatially different locations.

In accordance with the invention, the spatially asymmetrical quantum mechanical wavefunction can be made to assume a large number of different stable energy states, so as to provide multiple-level logic.

The wavefunction can be defined in first and second quantum wells, and the logical level can be determined by monitoring the conductance difference between the wells. In this way, degradation by background conductance is minimised.

Furthermore, the device, when in one of said states can be used in a number of different ways, for example as an amplifier or an amplitude modulation device. The device according to the invention can also be used as an oscillator.

The device can also be integrated with a high speed photoconductive switch to provide a high speed device for optoelectronic logic or modulation devices within a network of optically connected systems.

BRIEF DESCRIPTION OF THE DRAWINGS

FIG. 9b is an enlarged view of the photoconductive switch shown schematically in FIG. 9a;

FIG. 10a is a plan view of a CAQPC with an integrated array of photoconductive switches;

FIG. 10b is an enlarged view of a portion of one of the transmission lines shown in FIG. 10a;

FIG. 10c is a sectional view of the configuration shown in FIG. 10b;

FIG. 11a is a plan view of the connections to the CAQPC shown in FIG. 10;

FIG. 11b is an enlarged schematic illustration of the device 20 of FIG. 11a;

FIG. 11c is a sectional view of the configuration shown in FIG. 11a; and

DETAILED DESCRIPTION

Figure 1:
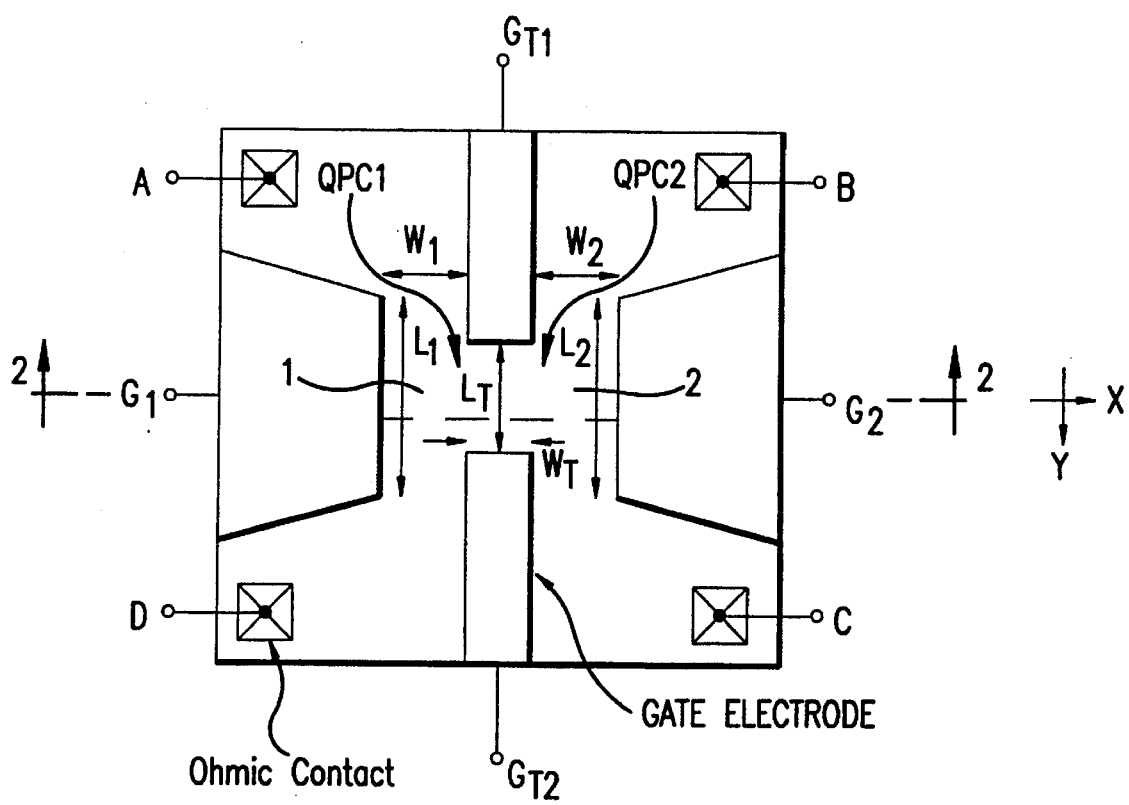
FIG. 1 is a top view of coupled asymmetric quantum point contacts (CAQPCs) which form a first example of a device in accordance with the invention.
Figure 2:
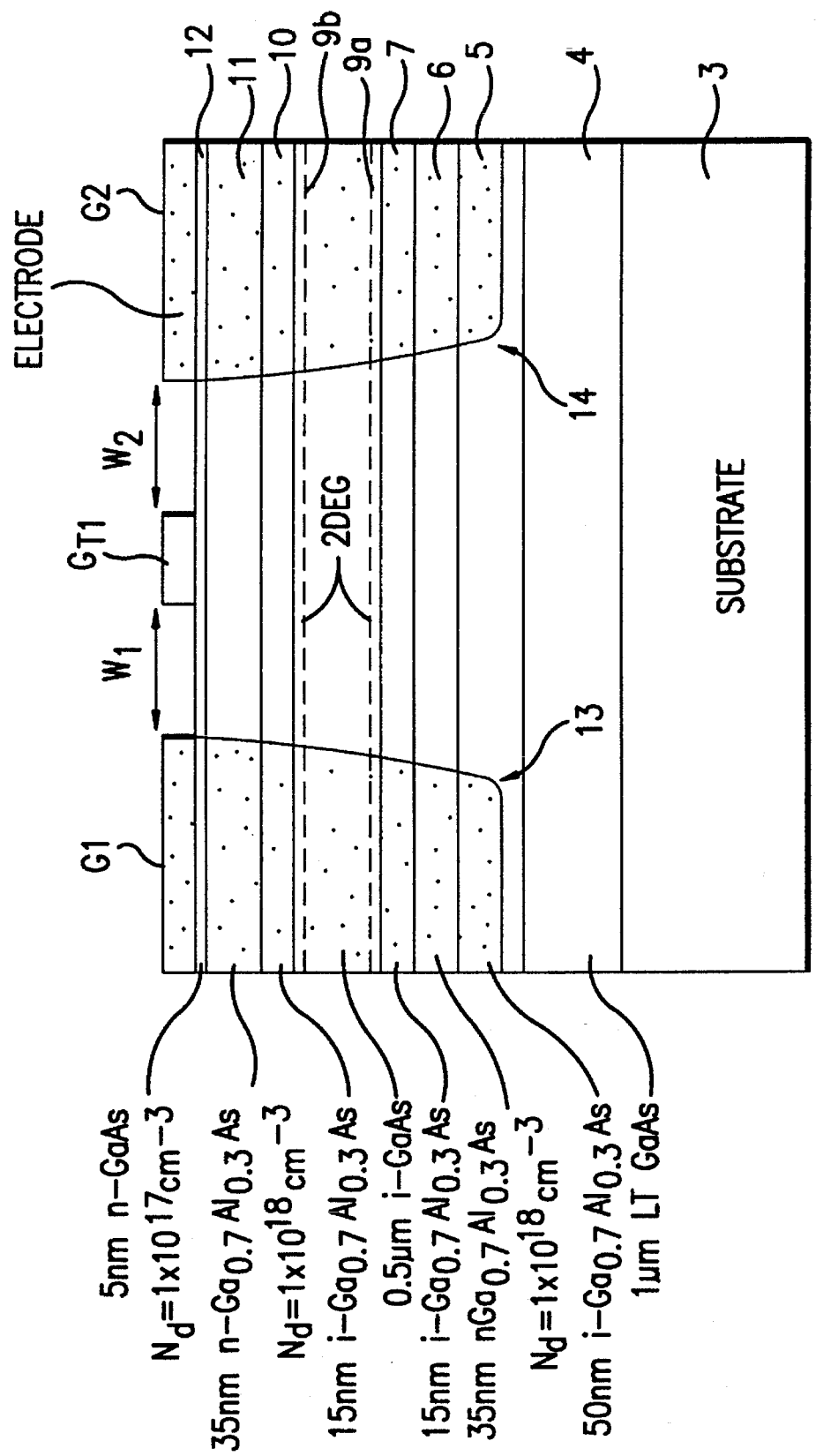
FIG. 2 is a cross section of the device shown in FIG. 1, taken in direction X, along line X—X'.

Referring to FIGS. 1 and 2, an example of a device in accordance with the invention is shown which makes use of two coupled asymmetric quantum point contacts (CAQPCs). The structure is fabricated on a semiconductor wafer, shown in section in FIG. 2, that contains a two-dimensional electron gas (2 DEG) at a heterojunction interface. In this embodiment, two 2 DEG layers are used in order to increase charge carrier transport.

Referring to FIG. 1, electrons are constrained to flow through two essentially one-dimensional constrictions between ohmic contacts A–D and B–C respectively, the constrictions being referenced 1,2 in FIG. 1. The constrictions are defined by electrodes G1, G2 which overlie the substrate, and electrodes $G_{T1}$ and $G_{T2}$, which form a barrier between the constrictions 1,2 except in a central region of width $L_T$.

Referring to FIG. 2, in which the device is shown in cross section, the device is conveniently fabricated on a GaAs substrate 3, on which is formed a relatively insulating low temperature (LT) GaAs layer 4, which is overlaid by a series of GaAlAs layers 5,6,7, with thicknesses as shown in the drawing. A GaAs layer 8 forms a heterojunction with layer 7 on its underside. Its upperside forms a heterojunction with an overlaid GaAlAs layer 10, which is overlaid by another such layer 11 and a GaAs passivation layer 12. As well known in the art, such a configuration produces an essentially two-dimensional electron gas at each heterojunction interface, referenced 9a and 9b, the lateral extent of which is controlled by depletion regions 13,14 produced by control potentials supplied to electrodes G1, G2.

Referring again to FIG. 1, the ohmic contacts A–D make contact with both of the 2 DEG regions 9a,9b. As a result, a first conduction path is provided between terminals A and D, and a second path is provided between terminals B and C, the paths extending through the constrictions 1,2 respectively. As previously stated, these constrictions constitute quantum point contacts (QPCs) of width and longitudinal extent $W_1,L_1$; $W_2,L_2$. The QPCs are separated by inversion layers produced by gate electrodes $G_{T1},G_{T2}$ but an asymmetrical coupling occurs in a region of dimensions $L_T$, $W_T$ between the electrodes.

The device is constructed on a nanometer scale and as a result, the quantum properties of wavefunctions dominate electron transport. Electrical conductance is limited by the transmission rate of electrons through each QPC and the quantum mechanical wavefunction profile in the device plays a significant role in the transmission rate. In accordance with the invention, the wavefunction is configured to have an asymmetrical profile and as a result, the transmission probability for each constriction 1,2 depends upon the energy levels set in the device. As will be explained hereinafter, at different energy levels, electrons preferentially travel along either constriction 1 or constriction 2 since the transmission probability oscillates between the constrictions as a function of the quantum number of the energy level and this permits electron transport to be switched between the constrictions 1 and 2. Also, since a large number of quantum states are available, the device can be used as a multiple-state logic device.

In order to achieve a symmetry of the quantum mechanical wavefunction in the region of the QPCs 1, 2, the widths of the constrictions W1, W2 are given different values. Typical dimensions for example shown in FIG. 1 are $W_1+W_T+W_2=800$ nm, $W_T=100$ nm, $L_T=200$ nm. $L_1$ and $L_2$ are each of the order of 1 μm. A 20% difference in $W_1$ and $W_2$ is typically provided to provide the asymmetry, such that $W_1=385$ nm and $W_2=315$ nm.

Figure 3A:
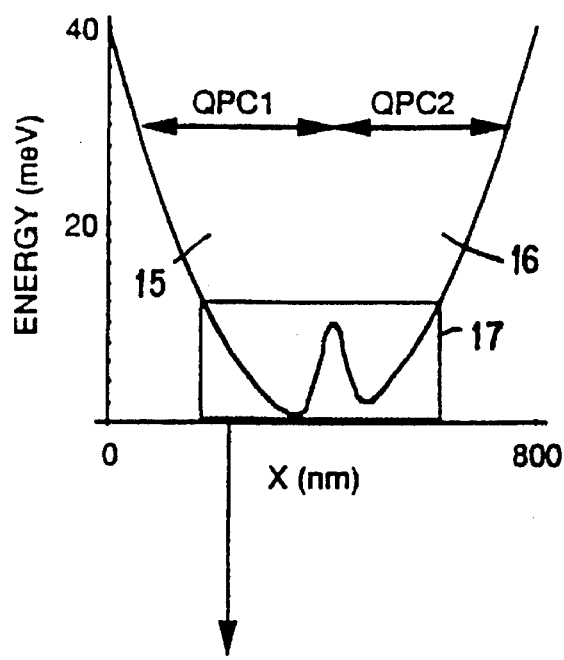
FIG. 3a illustrates the profile of the lateral electron confinement potential in the X direction indicated in FIG. 1, taken at the middle of the coupling region along the Y direction, i.e. corresponding to the section shown in FIG. 2.
Figure 3B:
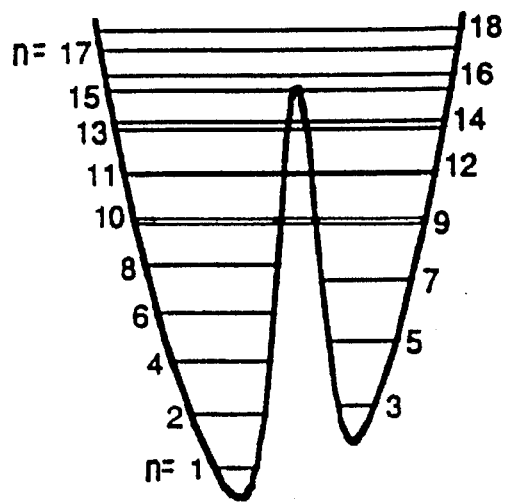
FIG. 3b is an enlarged view of the graph shown in FIG. 3a, showing stable energy states for electrons up to the 18th quantum number.
Figure 3C:
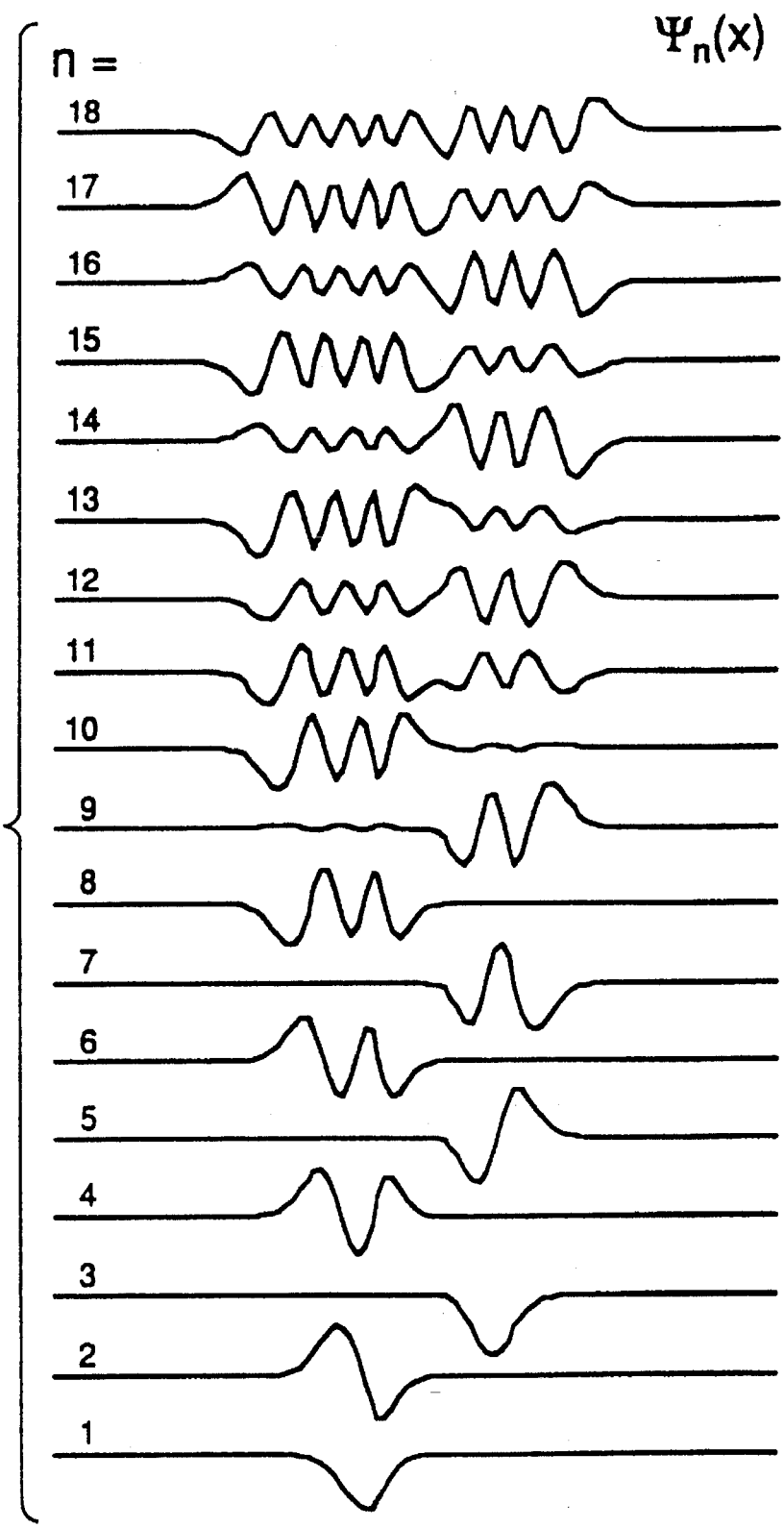
FIG. 3c illustrates the quantum wave function profiles up to the 18th quantum number calculated from the Schrödinger wave equation.

Referring now to FIG. 3(a), this shows a profile for the lateral electron confinement potential in the direction X—X' indicated in FIG. 1. The potential consists of an asymmetrical well configuration comprising wells 15,16 associated with QPC1 and 2 respectively, the well 15 being slightly narrower due to the asymmetry of the widths $W_1$, $W_2$. The well configuration includes a twin-asymmetric trough portion, shown within dotted outline 17. An enlarged view of the trough portion 16 is shown in FIG. 3(b). Stable energy states n=1 to 18 are shown. These have been computed by solving the Schrödinger wave equation for the potential well shown in FIG. 3(a), for energy levels of electrons up to the 18th quantum number, as shown in FIG. 3(c).

Referring to FIG. 3(b), in the twin-trough region it can be seen that for eigenstates that lie within the twin-trough region, the stable state falls either in a region associated with QPC1 or QPC2, but not both. For example when the energy level is such that n=4, the wavefunction localises in QPC1 whereas when n=5, the wavefunction localises in QPC2. This selective action occurs for a range of energy states, in this example from n=2 to 12. At higher electron states, the wave function extends across both of the QPcs so that dual channel conduction will occur, i.e. electron transport can occur in both QPCs simultaneously. Thus, by selecting the energy level for example, to lie within the range n=2 to 12, multiple state logic can be achieved. Switching between successive energy levels can be achieved by changing the applied voltage to the device. As a result, the conductance difference between QPC1 and QPC2 can be made to switch back and forth as a function of applied voltage.

Figure 4A:
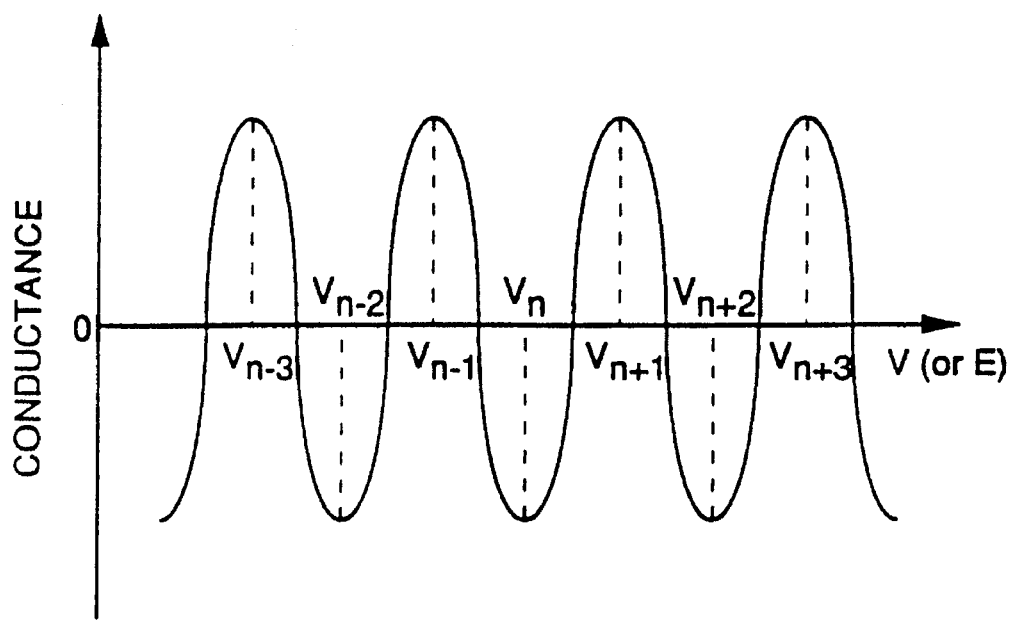
FIG. 4a is a graph of the conductance difference between the two quantum point contacts QPC1 and QPC2 as a function of applied voltage (or equivalently as a function of energy)

FIG. 4(a) shows the conductance difference as a function of voltage or equivalently as a function of energy. In this Figure the voltage in the horizontal axis represents a gate voltage applied to gates GT1 and GT2 of FIG. 1. The amplitude of the oscillation in the value of the conductance difference is less than the quantised conductance $2e^2/h$ per 2 DEG layer. $V_n$ indicates the voltage where the Fermi level coincides with the nth energy level. Thus, by changing the gate voltage, different resonant conditions with different energy levels are achieved and result in the energy levels switching back and forth between the different maxima and minima shown on the graph.

Figure 4B:
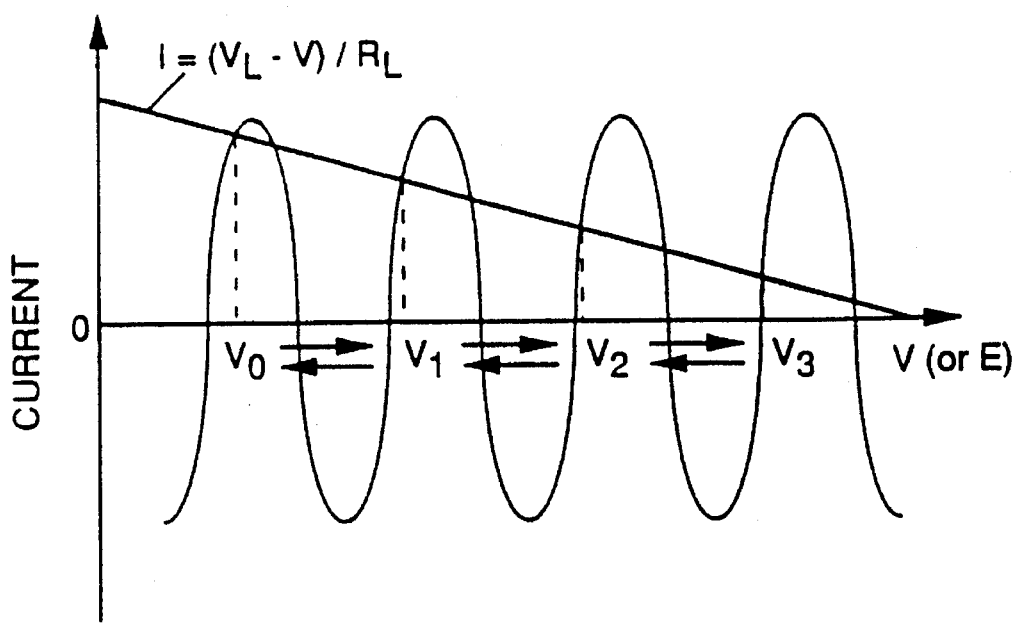
FIG. 4b is an illustration of 4-state logic operation for the device.

Referring now to FIG. 4(b), this illustrates four-state logic operation using the device, when connected to a series resistor $R_L$. For example, the resistor $R_L$ may be connected to terminal D shown in FIG. 1. The resistance is loaded with a voltage $V_L$ (as will be explained in more detail hereinafter). The graph shown in FIG. 4(b) illustrates how the device can be used for four-state logic operation with four stable operation voltage points V0 to V1. With the application of a positive or negative voltage pulse having an absolute value higher than $(V_n-V_{n-1})/2$, the circuit is switched between $V_{n-1}$ and $V_n$. Whilst a four-state device is described, it will be appreciated that a different degree of multiplicity can be set by appropriately choosing $V_L$ and $R_L$.

Figure 5:
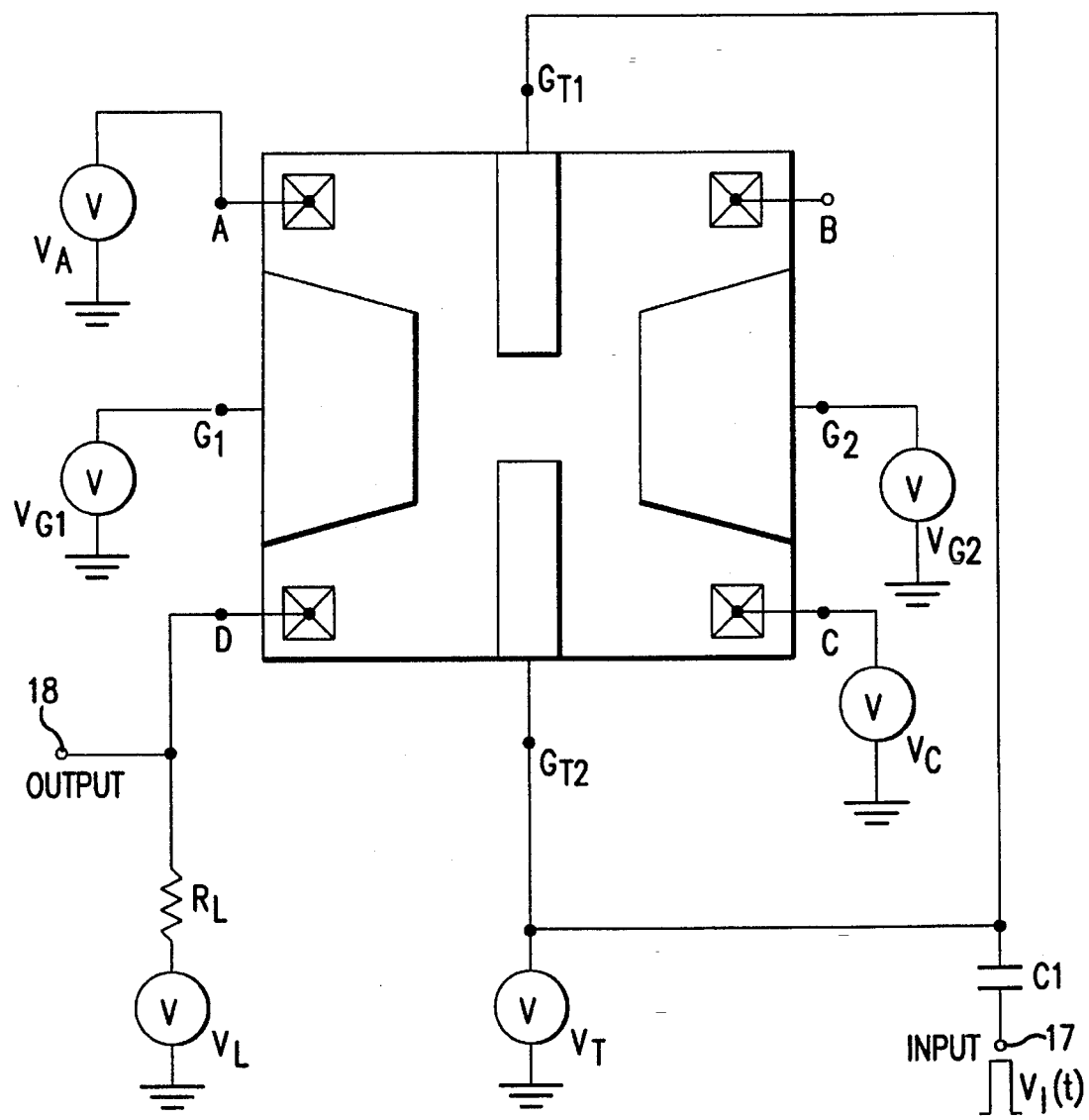
FIG. 5 is an example of a circuit utilising the device shown in FIG. 1 as a multiple-state logic device.

Referring now to FIG. 5, this shows a 4-voltage state device used for logic operation. The CAPC corresponds to that shown in FIGS. 1 and 2, and corresponding parts are marked with the same reference numerals. Voltage sources $V_A$, $V_{G1}$, $V_{G2}$, $V_T$ are connected as shown to the terminals A, $G_2$, C, $G_1$, and $G_{T1}$, $G_{T2}$ respectively. An input to the device is $V_f(t)$ is applied at terminal 17 through a capacitor C1 to the gates $G_{T1}$, $G_{T2}$. An output from the device is taken through a load resistor $R_L$ that is biased by a load voltage $V_L$, the output being derived at terminal 18.

In a typical example of operation of the device to provide 4-voltage-state logic, the gate voltages $V_{G1}$ and $V_{G2}$ applied to $G_1$ and $G_2$ are −0.9 V and that applied to $G_{T1}$ and $G_{T2}$ is −0.5 V. A voltage pulse $V_f(t)$ is superimposed on $V_T$ through the input terminal 17 so as to trigger a change between the stable voltage states $V_n$ and $V_{n-1}$. In this example the four-stable states $V_0$, $V_1$, $V_2$ and $V_3$ are 6 mV, 7 mV, 8 mV and 9 mV with equal spacing $V_n-V_{n-1}=1$ mV. In order to achieve the 4-state condition illustrated in FIG. 4(b), special consideration needs to be given to the relative values of $V_A$, $V_L$ and $V_C$ and the following condition needs to be establish $$V_A<V_L<V_C$$

Generally, under these conditions, the device operates such that current flows from terminal A to either terminal D or terminal C. The characteristics to current flow for the two paths is substantially the same. A typical current flowing through terminal D is about 1 μA with $R_L$=25 KΩ, $V_A$=−20 mV, $V_L$=−10 mV and $V_C$=0 mV.

Figure 7A:
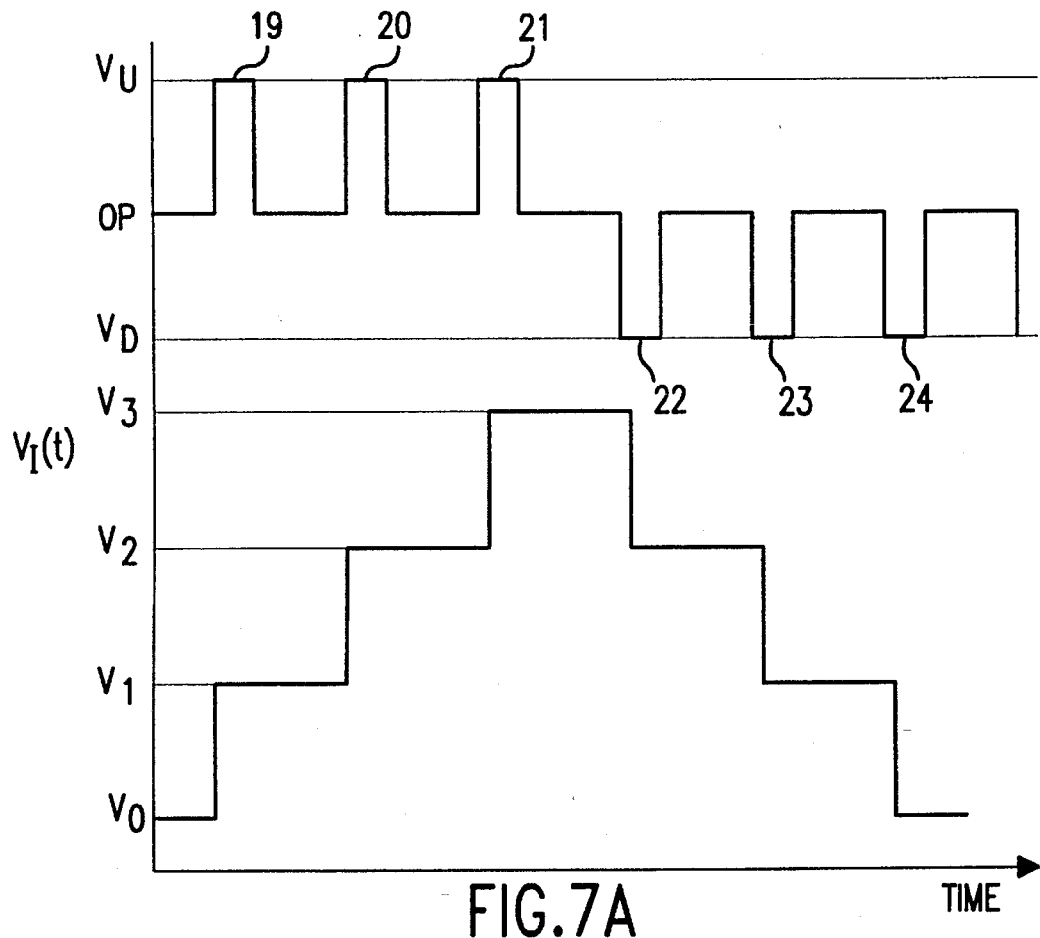
FIG. 7a illustrates wave forms applied to the device in FIG. 5 to achieve multiple-state digital operation.

Four-state flip-flop-like digital operation of this device is demonstrated in FIG. 7(a). In the upper part of the Figure a typical input wave form $V_I(t)$ is shown, which consists of a number of trigger pulses that, as previously described, trigger the circuit between four different stable states. The input waveform can switch from a median operating level $V_{OP}$ to an upper level $V_U$ or a lower level $V_D$. Thus, in FIG. 7(a), the input voltage includes three successive positive going pulses 19,20,21 followed by three negative going pulses 22,23,24.

The effect of these pulses on the output at terminal 18 (FIG. 5) is shown in the lower part of FIG. 7(a). Pulse 19 causes the output 18 to flip from voltage $V_0$ to $V_1$. Similarly, pulse 20 causes the output voltage to flip from stable state $V_1$ to $V_2$. Similarly, pulse 21 causes a change to stable state $V_3$. The negative going pulses 22,23,24 produce an inverse effect, so as to switch the stable state of the output 18 downwardly between the stable voltage levels.

The input voltage need not necessarily be applied to the gates $G_{T1}$ and $G_{T2}$. Instead, it could be superimposed on the voltage at terminal D.

It will be appreciated that electron flow through the device is essentially ballistic, controlled by the quantum mechanical wavefunction in the regions 1,2. Accordingly, the operation time scale for the device needs to be longer than the electron time of flight from terminals A to C or D. This will be of the order to a few ps and so the operation time scale can be of the order of 10 ps.

Figure 6:
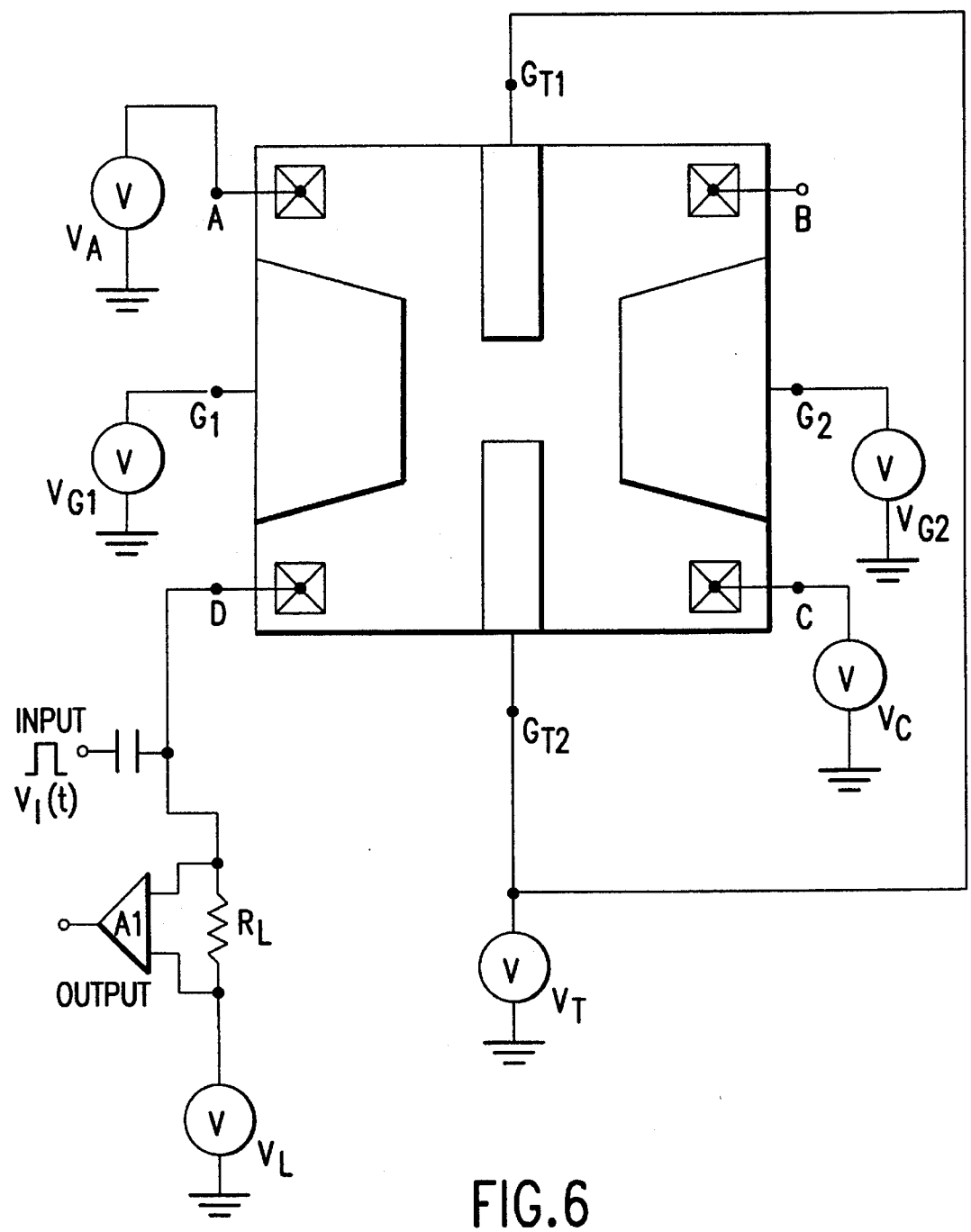
FIG. 6 is an example of the device for FIG. 1 arranged in a circuit for use as a memory.

The invention can also be used as a memory device and an example is illustrated in FIG. 6.

Figure 7B:
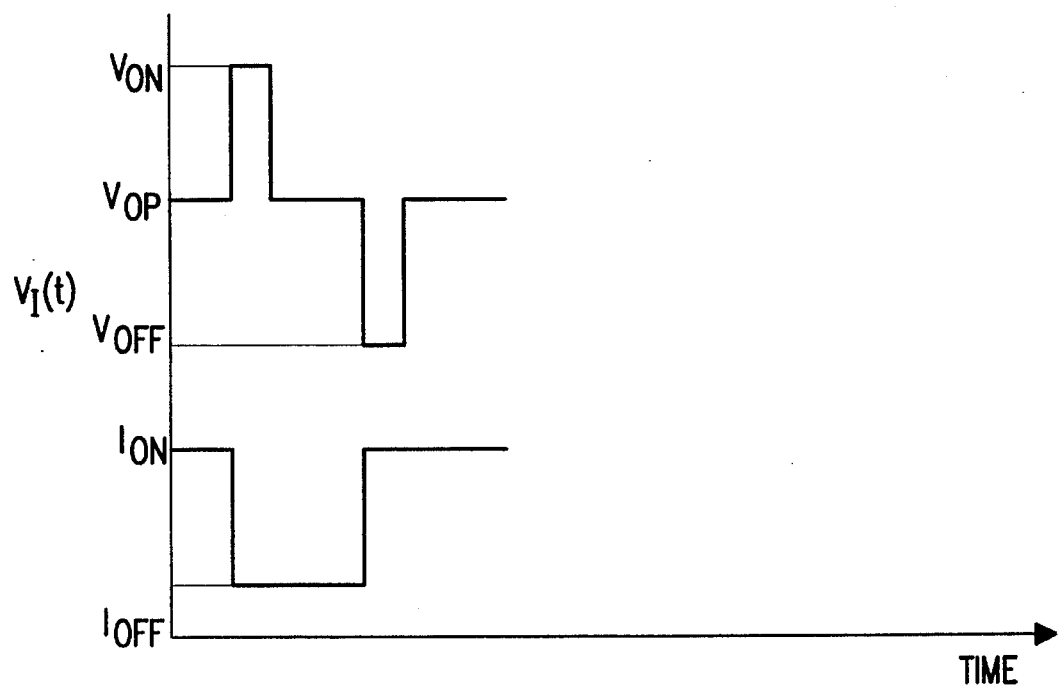
FIG. 7b illustrates voltages applied to the device shown in FIG. 6, for use as a memory.

The nomenclature of FIG. 6 corresponds to that of FIG. 5 and the device conditions and structures are all the same except that the input $V_I(t)$ is applied directly to terminal D and the current flowing in the output resistor $R_L$ is converted into an output voltage for example by means of a comparator A1. The result of memory operation for this device is shown in FIG. 7b. The input voltage $V_I(t)$ is switched from an operating level VOP to either an upper "on" voltage $V_{ON}$ or a lower "off" voltage $V_{OFF}$. The operating voltage $V_{OP}$ coincides with one of the four stable voltage points $v_n$. The on-off voltage should lie between 0.5 ($V_n-V_{n-1}$) and 1.0 ($V_n-V_{n-1}$). As shown in the lower part of FIG. 7(b), a pulse from $V_{OP}$ to $V_{ON}$ switches the current flowing in resistor $R_L$ from a current $I_{ON}$ to $I_{OFF}$, whereas the corresponding pulse from $V_{OP}$ to $V_{OFF}$ produces a reverse switching of the output load current from the $I_{OFF}$ to $I_{ON}$, thereby producing a memory operation. The memory operation can take place at the four stable voltage levels $V_n$ shown in FIG. 4(b).

Thus, by combining the four state logic device of FIG. 5 with the memory configuration shown in FIG. 6, two different degrees of freedom are realised for logic operation. Thus, by means of the device of FIG. 5, a first input can be used to switch between four different stable logic states and, by means of the input of FIG. 6, a memory function with each of those states can be provided. Thus, complicated multiple-state logic operations can be achieved by means of such a two-input device, with a single circuit element, thus providing a much more sophisticated logic element than a conventional two-state logic device.

Figure 8:
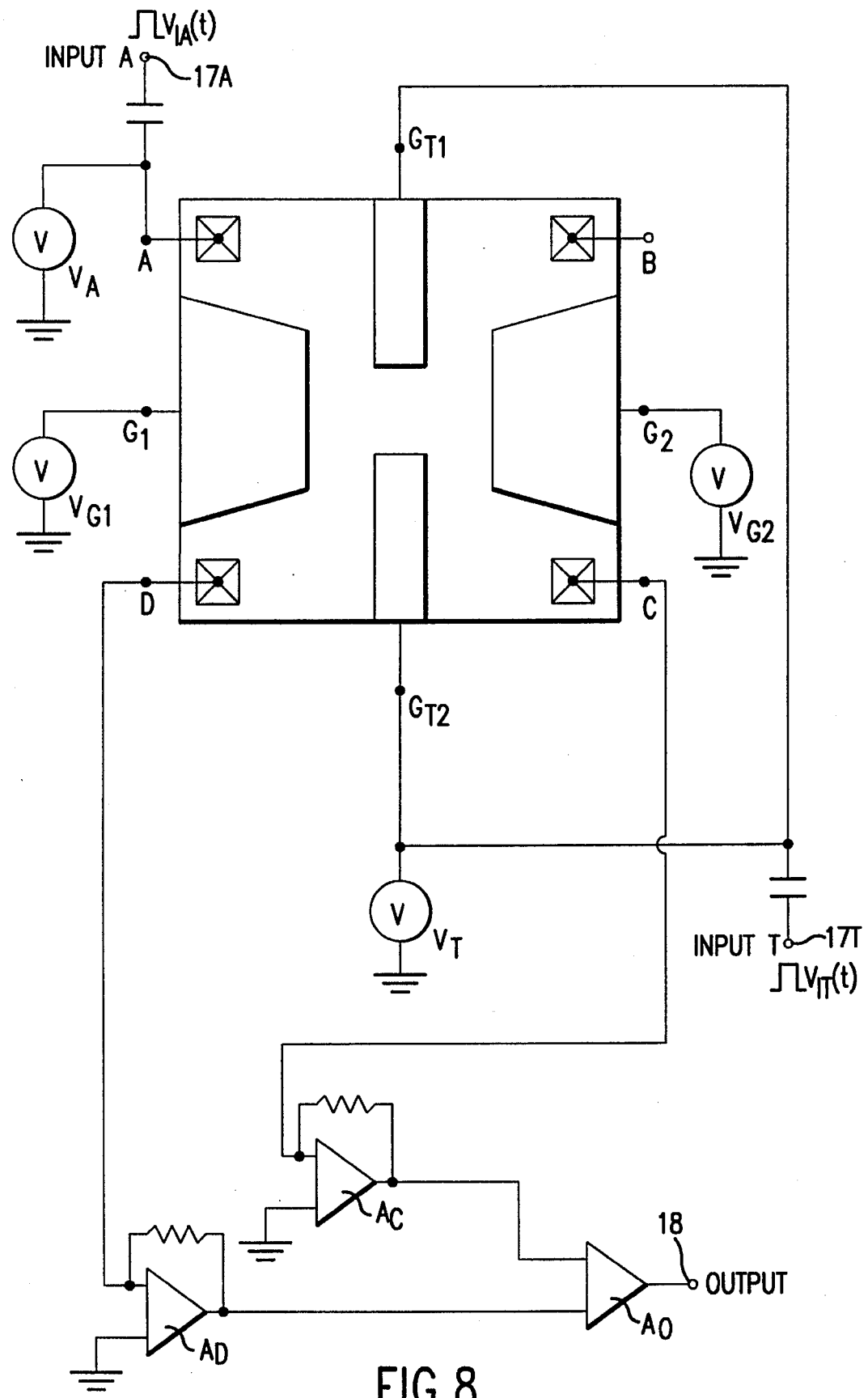
FIG. 8 is a circuit example of a signal processing device.

As previously explained, the invention also has other uses and FIG. 8 illustrates a signal processing device. In the circuit of FIG. 8, the same nomenclature is used as in the preceding Figures. Two input voltage pulse trains $V_{IA}(t)$ and $V_{IT}(t)$ are superimposed respectively on DC voltage $V_A$ and $V_T$, at input terminals 17A, 17T.

Outputs are taken from terminals D and C, amplified by amplifiers $A_D$ and $A_C$, the outputs of which are combined by output amplifier $A_O$ to provide an output at terminal 18.

This device can be used for the following purposes:

1. Amplifier

If the signal is applied to input 17A or B with no signal applied to the other, the device works as an amplifier. A small change to the input produces a large change at the output 18 according to the conductance characteristics shown in FIG. 4(a). Thus, in this example, the slope of the curve shown in FIG. 4(a), in the region of one of the stable voltage levels Vn, is used as the transfer function for the amplifier.

2. Amplitude-modulation (AM) device

An input signal applied to terminal 17A undergoes amplitude modulation through conductance modulation produced by a modulation voltage applied to input 17T.

3. Oscillator

Using the negative-differential resistance regions in the conductance characteristics shown in FIG. 4(a), an oscillator can be constructed. Reference is directed to S. M. Sze, Physics of Semiconductor Devices (John Wiley & Sons, N.Y., 1981) Chap. 9. Micro-wave emission phenomena based on negative-differential resistance is discussed. With such an arrangement, if the voltage $V_T$ is controlled, for example by an appropriate input at terminal 17T, the oscillation can be switched on and off and hence an oscillator including an amplitude modulator is fabricated. The voltage $V_T$ can be alternately biased on and off or, if an input is applied at 17T, it can be made to alternate between adjacent conductance peak and valleys shown in FIG. 4(a) in order to achieve appropriate modulation.

Figure 9A:
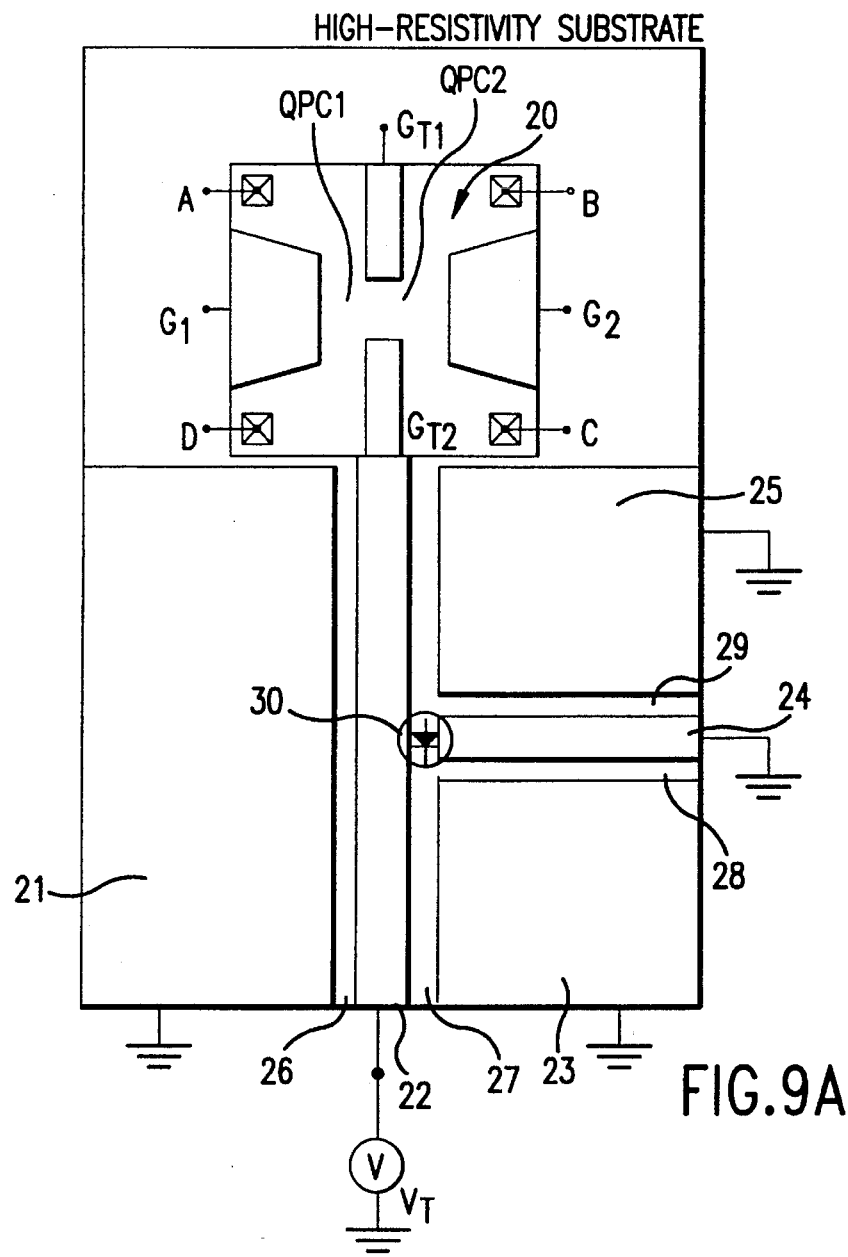
FIG. 9a is a top view of an integrated device containing a CAQPC according to FIG. 1 and a photoconductive switch.

Referring now to FIGS. 9(a) and (b), yet another embodiment of the invention is shown wherein the device is integrated into a high-speed photoconductive switch.

Figure 9B:
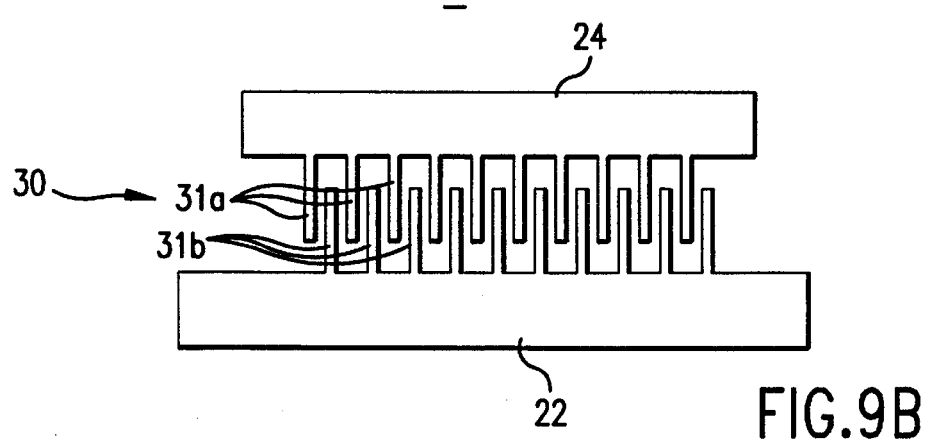

The device is formed in a substrate which has the same general structure as that shown in FIG. 2, with a CAQPC device, referenced generally at 20, which is of the same construction as described with reference to FIG. 1, with electrical connections (not shown) corresponding to those described with reference to FIG. 5. The substrate additionally includes overlying electrodes 21,22,23,24,25, formed in the same way as electrodes $G_1$ and $G_2$, spaced by non-conductive gaps 26,27. A further pair of non-conductive gaps 28,29 are similarly formed, on either side of electrode 24. An ultra-fast photoconductive switch (PCS) 30 is formed at the junction of electrodes 22 and 24. The PCS 30 is shown in more detail in FIG. 9(b) and consists of two sets of interdigitated fingers 31a,31b formed from the electrode material 22,24 overlying LT GaAs so as to provide an interdigitated metal-semiconductor-metal switch. An example of such an arrangement is described in more detail in J. Allam, K. Ogawa, J. White, N. deB. Baynes J. R. A.

Cleaver, I. Ohbu, T. Tanoue and T. Mishima, Ultrafast Electronics and Optoelectronics Conf., 1993. Reference is also directed to copending British Patent Application No. 9322246.1 filed on Oct. 28, 1993, entitled Interdigitated Photodetectors. Briefly, the recombination centers in the LTGaAs accelerate decay of photo-injected carriers and a high speed response of the switch is thereby realised. In FIG. 9(a), the result of incident photons is to produce a modulation on the electrode 22, which thereby modulates the voltage applied to gate $G_{T2}$ of the CAQPC 20, which produces switching or alteration of the asymmetric wave function, in the manner previously described. Thus, the PCS switch 30 can be used to produce logical switching between multiple voltage levels as previously described or alternatively, the device can be used to produce modulation in a manner generally described with reference to FIG. 8.

All of the devices disclosed herein can be integrated with such high-speed photo-conductive switches and operated in the picosecond time domain. Such devices can be utilised as optoelectronic logical modulation devices within a network of such optically interconnected systems.

A more sophisticated optical switching arrangement will now be described with reference to FIGS. 10(a) to (c) and 11(a) to (c). Referring to FIG. 10(a), the device is fabricated in the same general way as described with reference to FIG. 9 and the device includes an array of PCS's 30a–h, each connected to one of the terminals of the CAQPC 20 by a respective transmission line 32. Referring to the PCS 30h in more detail, it consists of two sets of interdigitated electrodes as described with reference to FIG. 9. The transmission line 32, formed in the same manner as transmission line 22 of FIG. 9, extends from the gate region $G_{T2}$ of the device 20, to a contact pad 33 at the edge of the substrate. At the location of PCS 30h, the transmission line 32h is provided with a first set of interdigitated electrodes, in the manner shown in FIG. 9 and the other interdigitated electrode set is coupled to transmission line 34 that extends to contact pad 35 at the edge of the substrate.

Referring to FIG. 10(b), the transmission line 32 is formed by selective etching of a conductive ground plane 36 to form parallel non-conducting gaps 37, 38 on opposite sides of the transmission line. Transmission line 34 is formed in a similar way. In use, a potential difference is applied to the contacts 33, 35, and when photons are incident upon the PCS 30h, an ultrafast electrical pulse is induced, which travels along the transmission line 32 to the gate $G_{T2}$ of the CAQPC 20.

Each of the other PCS's 30 is coupled in a similar manner to one of the inputs of the device 20, as can be seen in more detail in FIG. 11(a).

In FIG. 11(a), the connections to the device 20 are shown in more detail, in plan view. The device 20, shown in FIG. 11(b) is essentially the same as that shown in FIG. 1 and has its corresponding connections A–D, $G_{T1}$, $G_{T2}$, $G_1$, $G_2$ connected to a respective one of the transmission lines 32a–32h shown in FIG. 10(a). Two of the connections are shown in more detail in FIG. 11(a), for gate electrode $G_{T2}$ and connection C respectively. Considering the transmission line 32h, it is connected to a tapered conductive portion 39 which connects to the gate electrode $G_{T2}$ shown in FIG. 11(b). Considering the waveguide 32c, this is connected to an ohmic contact 40 which is connected to the 2 DEG regions 9 (FIG. 2) in QPC2 (FIG. 1).

From FIG. 11(c), it will be seen that the layers 5–12 (FIG. 2) are configured as a mesa, shown by outline 41 in FIG. 11(a), which overlies the LTGaAs photoconductive layer 4 on the substrate 3. Corresponding connections are made to the other gates and channels of the device 20.

Thus, in use, photons incident on the PCS's 30a–h can be used to trigger the multiple logic levels exhibited by the device 20 so that the device is switched between a number of multiple voltage output levels, dependent upon the number of trigger pulses produced by the various photoconductive switches 30. The output of the device can be detected as described previously with reference to FIG. 5, so as to provide a highly integrated, multiple level logic output system with a high degree of integration.

Figure 12:
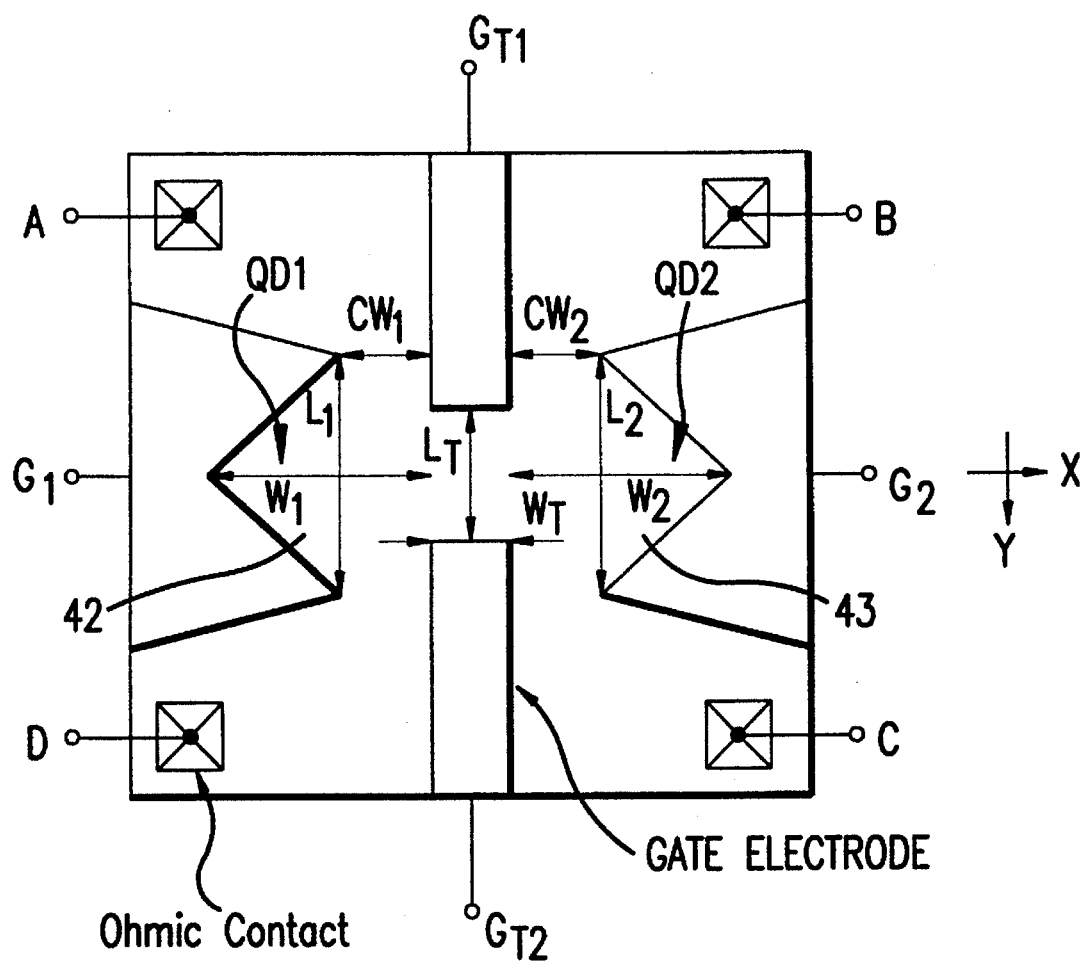
FIG. 12 is a top view of coupled asymmetric quantum dots (CAQDs), which can be used instead of the CAQPCs shown in FIGS. 1 and 2.

Referring now to FIG. 12, as an alternative to using a CAQPC, coupled asymmetric quantum dots (CAQDs) can be employed. As known in the art, quantum dots tend to constrain small numbers of electrons in a quantum well (in theory, single electrons can be constrained in this way) and as a result, CAQDs demonstrate a higher peak to valley ratio in their conductance or current-voltage characteristics (see FIG. 4) but a lower current level because of the higher degree of wavefunction confinement in the quantum dots. FIG. 12 illustrates a CAQD manufactured by the same techniques described with reference to FIGS. 1 and 2. The electrodes $G_1$ and $G_2$ are however each shaped in such a way as to provide an electron confinement region 42, 43 defining quatum dots QD1, QD2. Each QD has narrow conduction channels at both ends ($CW_1$ for example), which channels act as tunnelling barriers and confine strongly electron wave functions into the QDs. The sizes of CAQDs in FIG. 12 are as follows:

$W_1$=385 nm, $W_2$=315 nm, $L_1$=$L_2$=500 nm, $CW_1$=$CW_2$= 100 nm, $W_T$=100 nm and $L_T$=200 nm.

Many modifications and variations fall within the scope of the invention will be apparent to those skilled in the art. For example, although the devices have been described using two 2DEG conductive regions, it will be appreciated that in order to increase current flow, it would be possible to produce further heterojunctions and hence further conductive layers in a multiple layer structure.

Also, it is possible to fabricate the devices with materials other than GaAs as previously described. Two dimensional electron gas and the electrode structures are also available in $In_{1-x}Ga_xAs_yP_{1-y}$/InP and $Si_{1-x}Ge_x/Si_{1-y}Ge_y$ heterojunction interface layers and in Si/SiO$_2$ inversion layer.

The CAQPCs and CAQDs described hereinbefore are fabricated by means of split-gate processing with electron-beam lithography and metalisation. However, other methods could be used. For example focussed ion-beam implantation can be used to form the electrode structure shown in FIGS. 1 and 12. Also, a side-gate formation process can be used in which electron beam lithography, followed by chemical etching, can realise side-gate electrode structures for defining the region with an asymmetric quantum mechanical wave function.

We claim:

1. A nanofabricated multiple state electronic device comprising:

means for defining a quantum well configuration;

means for establishing a quantum mechanical charge carrier wavefunction defining multiple quantised stable energy levels in the quantum well configuration;

control means to assume different ones of said multiple quantised levels; and output means responsive to said multiple levels for defining corresponding multiple logical output conditions.

2. A device according to claim 1 further including a substrate, means on the substrate for producing the quantum well configuration in which said wavefunction is established, a source for carriers to be supplied to the well configuration, and drain for removing carriers from the well configuration.

3. A device according to claim 2 wherein the charge carrier wavefunction is spatially asymmetric with said stable levels occurring at spatially different locations.

4. A device according to claim 3 wherein the quantum well configuration includes first and second quantum well regions that are asymmetrically coupled so as to provide said asymmetrical wave function, with said energy levels respectively occurring either in one or the other of the quantum well regions.

5. A device according to claim 4 wherein said well regions each comprise a quantum point contact that includes a source, a drain, and electrode means defining a constriction, the constrictions contacts being separated by gate electrode means configured to permit asymmetrical wavefunction coupling between said constrictions.

6. A device according to claim 5 wherein each quantum point contact includes an essentially two-dimensional electron gas extending between the source and drain through the constriction thereof.

7. A device according to claim 4 including input means for applying an input trigger pulse to cause the device to assume an energy level wherein the quantum mechanical wavefunction assumes a state such that conduction occurs preferentially in a particular one of said constrictions.

8. A device according to claim 7 including a load resistance connected to one of said drains, means for applying a load voltage to said load resistance, and output means responsive to the voltage developed at said drain, whereby said input pulse sequentially switches said output between multiple logic levels.

9. A device according to claim 7 including output means responsive to the voltage developed across said output resistance and input means for applying an input pulse to said drain, whereby to provide a memory function.

10. A device according to claim 2 including output means for monitoring the conductance difference of said first and second quantum wells.

11. A device according to claim 2 operative as a modulator, including input means for modulating a voltage applied to the device whereby to modulate the current developed at at least one of said drains.

12. A device according to claim 11 wherein said voltage is connected to said source.

13. A device according to claim 11 wherein said input means is connected to said control means.

14. A device according to claim 4, wherein said quantum wells are configured as quantum dots.

15. A device according to claim 1 and operative as an amplifier.

16. A device according to claim 1 and operative as an oscillator.

17. A device according to claim 1 connected to a photoconductive switch.

18. A device according to claim 17 wherein the photoconductive switch comprises a photosensitive layer, and first and second sets of interdigitated electrodes that overlie the photosensitive layer.

19. A device according to claim 18 wherein the photosensitive layer is formed of low temperature GaAs material.

20. A device according to claim 17 and an array of the photosensitive switches each connected to a respective terminal of the device.

21. A device according to claim 20 including transmission lines connecting the switches respectively to the terminals of the device.

22. A nanofabricated photodetector device comprising:

means for defining a quantum well configuration;

means for establishing in the quantum well configuration a quantum mechanical charge carrier wavefunction defining quantised stable energy levels, a photodetector for developing a voltage transition in response to incident photons; and control means for supplying said voltage transition to the quantum well configuration to cause a transition between said stable energy levels, and output means, responsive to a change in the energy level of the quantum well configuration, to provide an output as a function of detection of the incident photons.

* * * * *

UNITED STATES PATENT AND TRADEMARK OFFICE
CERTIFICATE OF CORRECTION

PATENT NO. : 5,485,018
DATED : January 16, 1996
INVENTOR(S) : Kensuke Ogawa, et al.

It is certified that error appears in the above-indentified patent and that said Letters Patent is hereby corrected as shown below:

IN THE ABSTRACT, line 6: Change "asmmetric" to --asymmetric--.

| Column | Line | |
|--------|------|---|
| 2 | 16 | Change "Schr" to --Schrö--. |
| 2 | 17 | Change "odinger" to --dinger--. |
| 5 | 3 | Change "establish" to --established--. |
| 6 | 45 | Change "peak" to --peaks--. |
| 8 | 33 | After "invention" insert --and--. |
| 8 | 62 | After "means" insert --for causing charge in the well configuration--. |

Signed and Sealed this

Twenty-first Day of May, 1996

*Attest:*

BRUCE LEHMAN

*Attesting Officer*   Commissioner of Patents and Trademarks